(12) United States Patent
Uhm

(10) Patent No.: US 11,969,642 B2
(45) Date of Patent: Apr. 30, 2024

(54) DIGITAL DIRECTION-GUIDING APPARATUS FOR GOLF PUTTING

(71) Applicants: KAISHOT CO., LTD., Seoul (KR); Hyun Duk Uhm, Seoul (KR)

(72) Inventor: Hyun Duk Uhm, Seoul (KR)

( * ) Notice: Subject to any disclaimer, the term of this patent is extended or adjusted under 35 U.S.C. 154(b) by 234 days.

(21) Appl. No.: 17/609,371

(22) PCT Filed: Apr. 7, 2020

(86) PCT No.: PCT/KR2020/004675
§ 371 (c)(1),
(2) Date: Nov. 6, 2021

(87) PCT Pub. No.: WO2020/226287
PCT Pub. Date: Nov. 12, 2020

(65) Prior Publication Data
US 2022/0212085 A1 Jul. 7, 2022

(30) Foreign Application Priority Data

May 9, 2019 (KR) .......................... 10-2019-0054323

(51) Int. Cl.
*A63B 69/36* (2006.01)
*A63B 71/06* (2006.01)

(52) U.S. Cl.
CPC ...... *A63B 71/0622* (2013.01); *A63B 69/3676* (2013.01); *A63B 2071/0694* (2013.01); *A63B 2220/18* (2013.01)

(58) Field of Classification Search
CPC ............ A63B 2220/18; A63B 69/3676; A63B 57/353
See application file for complete search history.

(56) References Cited

U.S. PATENT DOCUMENTS 6,890,273 B1 * 5/2005 Perez ................. A63B 69/3676
 473/407
7,226,370 B1 * 6/2007 Cope ................... A63B 57/207
 473/406

(Continued)

FOREIGN PATENT DOCUMENTS

JP H9-056867 A 3/1997
JP 2006136641 A * 6/2006

(Continued)

OTHER PUBLICATIONS

International Search Report for PCT/KR2020/004675 dated Jul. 27, 2020.

*Primary Examiner* — Steven B Wong

(57) ABSTRACT

Proposed is a digital direction-guiding apparatus for golf putting, which is a full body management system using cryogenic circulating cooling by the grafting of IT technology, the digital direction-guiding apparatus including a tri-axial MEMS sensor (100), a digital left and right inclination angle indication pointer (200), a digital up and down inclination angle indication pointer (300), a digital display unit (400), and a microprocessor (500). Thus, the digital direction-guiding apparatus including the tri-axial MEMS sensor, the digital left and right inclination angle indication pointer configured to indicate a putting direction, and the digital display unit configured to display the angle of a left and right inclination of the green may easily display a putting direction indication pointer and the angle of up and down inclination in a sophisticated digitized shape and may provide a thin apparatus.

4 Claims, 9 Drawing Sheets

(56) References Cited

U.S. PATENT DOCUMENTS

| | | | |
|---|---|---|---|
| 10,293,236 B2 | 5/2019 | Uhm | |
| 2008/0056621 A1* | 3/2008 | Green | G01C 9/06 |
| | | | 382/314 |
| 2009/0119938 A1 | 5/2009 | Song | |
| 2012/0071277 A1* | 3/2012 | Denton | A63B 69/36 |
| | | | 473/407 |
| 2013/0237346 A1 | 9/2013 | Sweeney | |

FOREIGN PATENT DOCUMENTS

| | | | | |
|---|---|---|---|---|
| JP | 2008-533463 A | | 8/2008 | |
| JP | 2010-538764 A | | 12/2010 | |
| JP | 3192765 U | | 9/2014 | |
| JP | 3202909 U | | 3/2016 | |
| KR | 10-2012-0131037 A | | 12/2012 | |
| KR | 20130083241 A | * | 7/2013 | |
| KR | 20140046805 A | * | 4/2014 | |
| KR | 1467218 B1 | * | 12/2014 | G06F 3/00 |
| KR | 10-1615216 B1 | | 4/2016 | |
| KR | 10-1774012 B1 | | 8/2017 | |
| KR | 101836000 B1 | * | 3/2018 | |
| KR | 10-2018-0036004 A | | 4/2018 | |
| KR | 20180036004 A | * | 4/2018 | |
| KR | 10-1883104 B1 | | 7/2018 | |
| KR | 101883104 B1 | * | 7/2018 | |
| KR | 10-1961867 B1 | | 3/2019 | |
| KR | 20190086336 A | * | 7/2019 | |
| KR | 20190109371 A | * | 9/2019 | |
| WO | 2009039073 A1 | | 3/2009 | |

* cited by examiner

DIGITAL DIRECTION-GUIDING APPARATUS FOR GOLF PUTTING

TECHNICAL FIELD

The present disclosure relates to a digital direction-guiding apparatus for golf putting and, more particularly, to a digital direction-guiding apparatus capable of displaying an angle of an inclination of a sloped surface between a location of a golf ball placed on a green and hole cup of a golf course with a digitized direction indicator using a tri-axial acceleration sensor and an LCD display.

BACKGROUND ART

In general, a putting operation in golf is mainly performed in a last step of putting a golf ball into a hole cup, so it is one of the motions requiring a high degree of concentration and precise directionality in consideration of a sloped surface of a green.

A success rate of a putting may be increased only when a gradient between a point at which the golf ball is lying and the hole cup is accurately determined. However, the green of the golf course is designed in various types of sloped surfaces around the hole cup, so most golfers are incapable of determining the gradient of the green, thereby having difficulty in performing putting.

There are several products and patents that provide an indication of a golf putting direction as an auxiliary means to increase the accuracy of a putting by overcoming the difficulties during the putting as described above, but there is a problem in that the accuracy of the putting is lowered because the direction, a center location, and directionality of the golf ball indicated by each product according to a related art is not matched with each other.

As a means for solving the above-described problem, a technique using a level gauge for measuring a gradient using a movement of air bubbles by filling a liquid in a cylindrical transparent container and then forming air bubbles is disclosed.

However, in the case of using the level gauge using air bubbles as described above, since the level gauge is formed in a cylindrical shape, a vertex of the inclination may be confirmed, but there is a problem in that it is difficult to confirm an angle and a direction of an inclination. In particular, since the air bubble of the above-mentioned level gauge moves only in an upward direction, even when there is a movement of the air bubble, it is not possible to confirm how many degrees of the inclination it is by accurately measuring the inclination with divisions. Therefore, only an approximate inclination may be confirmed, and as a result, it is difficult to have accurate putting directionality.

In addition, an electronic putting gradient measurer among conventional arts is used, but the technology of displaying a putting gradient and an up and down inclination in a digital way provides a golfer to look only at the digitized slope angle display of the product, thereby allowing the golfer to recognize a numerical value of the angle of an inclination in his or her head. Accordingly, while drawing the slope angle of the golf ball in his or her head substantially by measuring with the eye by regarding an actual hole cup direction as a reference line, it is possible for the golfer to roughly perform putting the golf ball toward the sloped surface. However, as a result, there is a problem with accuracy.

On the other hand, according to a technique is disclosed in the direction guide device for golf putting of Republic of Korea Patent No. 10-1774012 (issue date: Aug. 28, 2017), when a golf ball is seated on a green, the direction guide device for golf putting as a substitute for a marker is placed such that a hole cup aiming reference line is matched up with a center of a hole cup, and then a golf ball line is aligned to be in a straight line in a direction indicated by an analog type putting direction pointer. When putting the golf ball is performed in the golf ball line direction after the direction guide device for golf putting is removed, the golf ball approaches the hole cup while forming a certain curve along the sloped surface of the green so that accurate putting is performed.

However, the direction guide device for golf putting of the above-mentioned Republic of Korea Patent has a mechanical and analog structure and is accurately applied to the physical principle that a rotary pendulum is always maintained to stay toward the Earth's central axis. Therefore, when the inclination occurs, a physical friction force is induced between the rotary weight and the direction pointer, so in order to reduce minute errors due to frictional force, the weight of the rotary pendulum should be configured to be heavy enough to overcome the physical frictional force.

Accordingly, the present disclosure is intended to propose a digital direction-guiding apparatus for golf putting that enables accurate putting to be performed in the direction indicating an angle of an inclination according to the sloped surface of the green by digitizing the conventional mechanical and analog configuration to improve user's visibility and configuring the Micro-Electro-Mechanical System (MEMS) sensor, thereby allowing the putting direction to be indicated while accurately displaying the angle of an inclination on any sloped surface regardless of the up and down and left and right sloped surfaces.

DOCUMENTS OF RELATED ART (Patent Document) Korean Patent No. 10-1774012 (Publication Date: Sep. 1, 2017)

DISCLOSURE

Technical Problem

Accordingly, the present disclosure has been made keeping in mind the above problems occurring in the related art, and an objective of the present disclosure is not to provide a conventional mechanical and analog structure but to provide a digital direction-guiding apparatus for golf putting, wherein the digital direction-guiding apparatus includes: a Micro Electro-Mechanical Systems (MEMS) sensor; a digital left and right inclination angle indication pointer indicating a putting direction; and an LCD display device configured to display a digital angle of an up and down inclination indicating an up and down inclination of a green, thereby allowing a putting direction indication pointer and the angle of the up and down inclination to be easily and stylishly displayed in a digital form and having a thin thickness Another objective of the present disclosure is to allow a putting direction to be accurately indicated while an angle of the left and right inclination to be accurately displayed on any sloped surface regardless of up and down and left and right sloped surface, thereby allowing an accurate putting to be performed in a direction indicating an angle of an inclination according to a sloped surface of the green.

Technical Solution

In order to accomplish the above objective, the present disclosure provides a digital direction-guiding apparatus for golf putting, the digital direction-guiding apparatus including: a tri-axial MEMS sensor 100 configured to measure an angle of a left and right inclination or an angle of an up and down inclination of a point at which a golf ball 30 is seated with respect to a location of a hole cup 20 after a direction indicated by a hole cup aiming reference line 10 matches up with a center of the hole cup 20; a digital left and right inclination angle indication pointer 200 configured to indicate a putting direction in correspondence to the angle of the left and right inclination with respect to the location of the hole cup 20 by receiving a left and right inclination angle measurement value; a digital up and down inclination angle indication pointer 300 configured to display the angle of the up and down inclination of the point at which the golf ball 30 is seated with respect to the location of the hole cup 20 by receiving an up and down inclination angle measurement value; a digital display unit 400 configured to output the left and right inclination angle measurement value and the up and down inclination angle measurement value, measured above, on a screen; and a microprocessor 500 built into a main body and configured, through the digital display unit 400, to control the left and right inclination angle measurement value and the up and down inclination angle measurement value to be output to the screen.

The digital direction-guiding apparatus may further include: an inclination angle display magnification adjustment unit 600 provided on a rear surface of the main body and configured to control the left and right inclination angle measurement value and the up and down inclination angle measurement value to be displayed in accordance with the received magnification; and a coin-type small battery 700 configured to supply power.

The digital left and right inclination angle indication pointer 200 may be configured, according to the left and right inclination angle measurement value received from the tri-axial MEMS sensor 100 when the main body is placed behind the golf ball on a green, to be marked in a right direction in response to the angle of an inclination when the angle of the inclination is determined to be toward the left by a green inclination and to be marked in a left direction in response to the angle of the inclination when the angle of the inclination is determined to be toward the right by the green inclination.

The digital up and down inclination angle indication pointer 300 may be configured, according to the up and down inclination angle measurement value received from the tri-axial MEMS sensor 100 when the main body is placed on a green, to output an arrow guiding that a slope of a front side is downhill by being marked rearward when a seating point of the golf ball 30 is higher compared with the location of the hole cup 20 and to output an arrow guiding that the slope of the front side is uphill by being marked forward when the seating point of the golf ball 30 is lower compared with the location of the hole cup 20.

The digital direction-guiding apparatus may further include: a ring 800 detachable on a lower end of the main body, wherein the ring 800 is fittedly coupled to the main body and configured as a marker engraved with text or symbols that comply with a user's demand on a surface thereof.

Advantageous Effects

According to the present disclosure as described above, it is possible to provide not a conventional mechanical and analog structure but a digital direction-guiding apparatus for golf putting, wherein the digital direction-guiding apparatus includes: a tri-axial MEMS sensor; a digital left and right inclination angle indication pointer configuration indicating a putting direction; and an LCD display device configured to display an angle of a digital up and down inclination indicating the angle of an up and down inclination of a green, thereby allowing a putting direction indication pointer and the angle of an up and down inclination to be easily and stylishly displayed in a digital form and having a thin thickness.

According to the present disclosure, by applying a tri-axial MEMS sensor, it is possible not only to accurately indicate the angle of the left and right inclination corresponding to the left and right sloped surfaces to indicate the putting direction but also to indicate the angle of an up and down inclination according to the sloped surface of the green.

Accordingly, when the main body is placed on the green, it is possible to recognize in advance whether the seating point of the golf ball is higher or lower compared with the location of the hole cup so as to allow an accurate putting can be performed.

BEST MODE

Specific features and advantages of the present disclosure will become more apparent from the following detailed description taken in conjunction with the accompanying drawings. Prior to this, terms or words used in the present specification and claims should be interpreted as corresponding meaning and concept based on the technical idea of the present disclosure on the basis of the principle that the inventor may appropriately define the concept of the term in order to best describe his or her disclosure. In addition, it should be noted that, when it is determined that the detailed description of the well-known functions related to the present disclosure and the configuration of same may unnecessarily obfuscate the gist of the present disclosure, the detailed description thereof is omitted.

Figure 1:
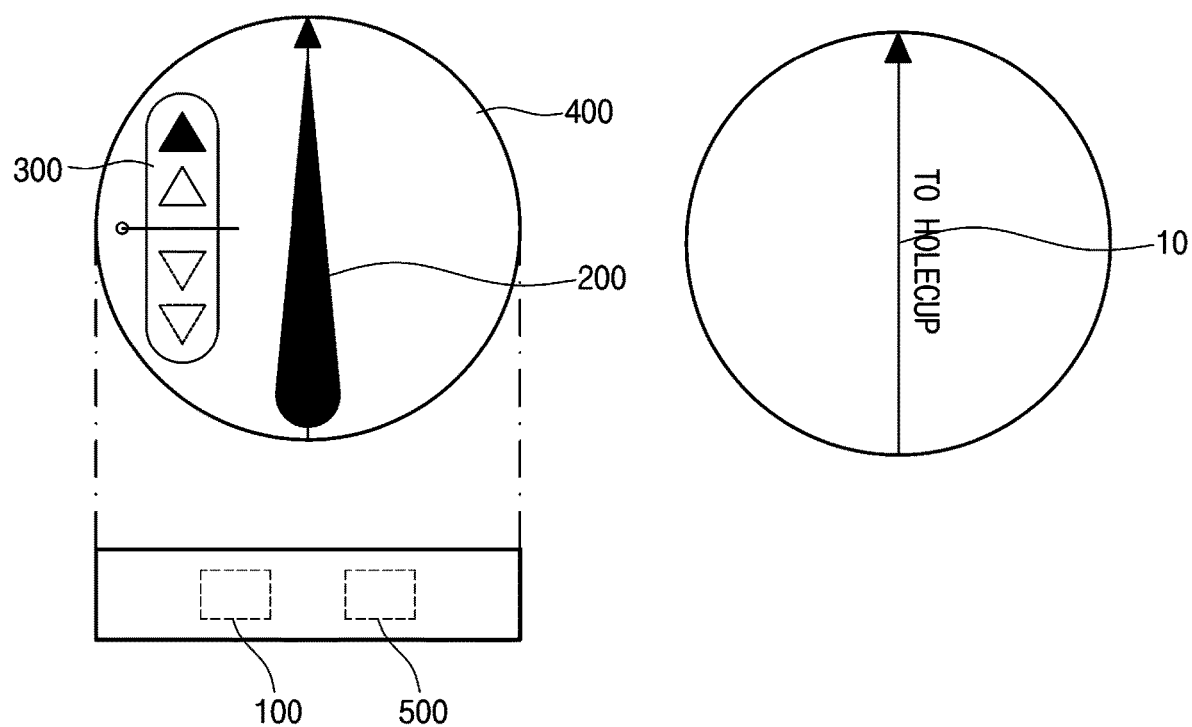
FIG. 1 is a schematic view showing a digital direction-guiding apparatus for golf putting according to an embodiment of the present disclosure.

With reference to FIG. 1, a digital direction-guiding apparatus 1000 for golf putting of the present disclosure includes: a tri-axial Micro-Electro-Mechanical System (MEMS) sensor 100 configured to measure an angle of a left and right inclination or an angle of an up and down inclination of a point at which a golf ball 30 is seated with respect to a location of a hole cup 20 after a direction indicated by a hole cup aiming reference line 10 matches up with a center of the hole cup 20; a digital left and right inclination angle indication pointer 200 configured to indicate a putting direction with respect to the location of a hole cup 20 by receiving a left and right inclination angle measurement value; a digital up and down inclination angle indication pointer 300 configured, when a main body is placed on the green, to display the angle of the up and down inclination of the green comparing a seating point of the golf ball 30 to the location of the hole cup 20 by receiving an up and down inclination angle measurement value; a digital display unit 400 configured to output the left and right inclination angle measurement value and the up and down inclination angle measurement value, measured above, on a screen; and a microprocessor (500) built into a main body and configured, through the digital display unit (400), to control the left and right inclination angle measurement value and the up and down inclination angle measurement value to be output to the screen.

At this time, the tri-axial MEMS sensor 100 is configured to measure the angle of an inclination with respect to three axes of X, Y, and Z and to measure the angle of an inclination between a current location at which the main body is placed and a target point, that is, the angle of a left and right inclination and the angle of an up and down inclination between the location of the golf ball 30 and the hole cup 20.

In addition, the digital display unit 400 is composed of any one of LCD, LED, OLED, QLED, or Micro LED and is configured on a top surface part of the main body.

Figure 2:
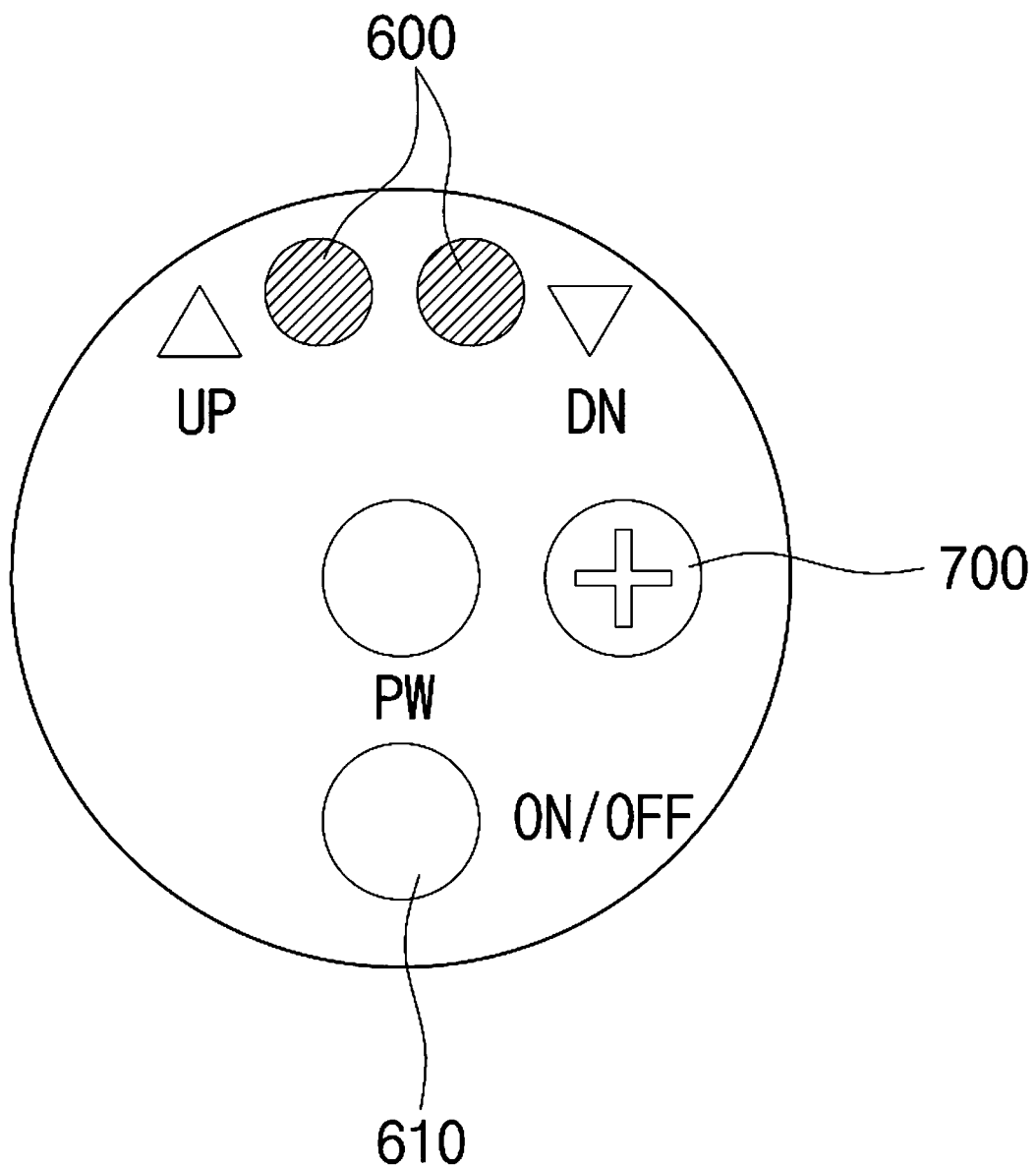
FIG. 2 is a rear view of the digital direction-guiding apparatus for golf putting according to the embodiment of the present disclosure.
Figure 3:
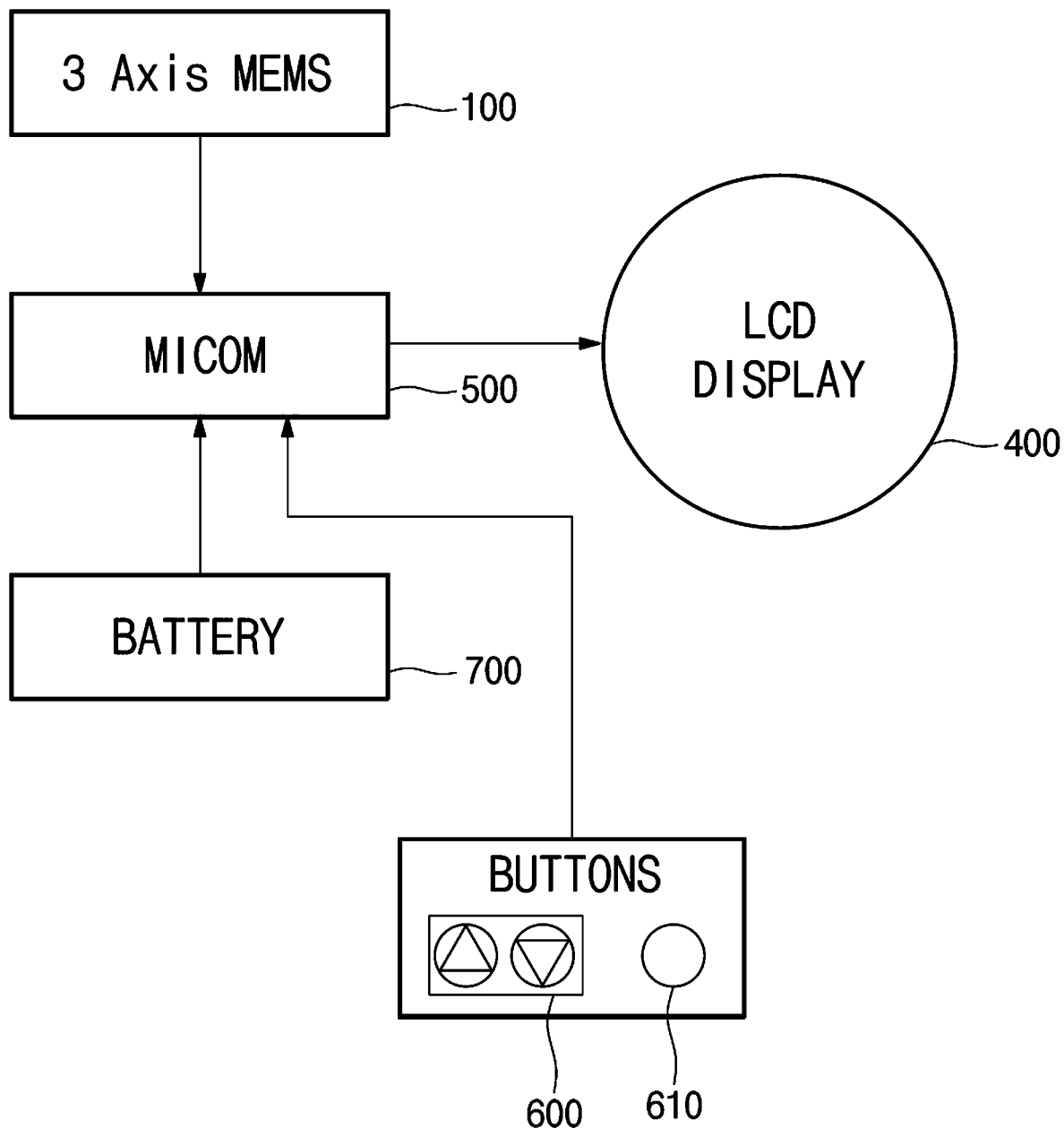
FIG. 3 is an electronic configuration block diagram of the digital direction-guiding apparatus for golf putting according to the embodiment of the present disclosure.

FIG. 2 is a rear view of the digital direction-guiding apparatus for golf putting according to the embodiment of the present disclosure, and FIG. 3 is an electronic configuration block diagram of the digital direction-guiding apparatus for golf putting according to an embodiment of the present disclosure.

With reference to FIGS. 2 and 3, the digital direction-guiding apparatus further includes: an inclination angle display magnification adjustment unit 600 provided on a rear surface of the main body and configured to control the left and right inclination angle measurement value and the up and down inclination angle measurement value to be displayed in accordance with the received magnification; and a coin-type small battery 700 configured to supply power.

Specifically, the inclination angle display magnification adjustment unit 600 configured to adjust the magnification of the left and right inclination angle measurement value and the up and down inclination angle measurement value to be displayed through the digital display unit 400 includes an UP button and a down (DN) button configured to provide magnification of the left and right inclination angle measurement value and the up and down inclination angle measurement value that are specified to individual golfers.

That is, the magnification of left and right inclination angle measurement value and of the up and down inclination measurement value to be displayed through the digital display unit 400 is output by being enlarged as much by a preset magnification according to an input signal for the UP button, and the magnification of the left and right inclination angle measurement value and of the up and down inclination measurement value to be displayed through the digital display unit 400 is output by being reduced as much by a preset magnification according to an input signal for the DN button.

At this time, the inclination angle display magnification adjustment unit 600 is configured to memorize the last inputs of the UP button and the DN button and then to control such that the left and right inclination angle measurement value and the up and down inclination angle measurement value may be output by the digital display unit 400 at a magnification that matches the last input.

As the inclination angle display magnification adjustment unit 600 is configured as described above and since each golfer has a different strength of force when performing putting with a putter, each golfer may set an inclination angle magnification appropriate to himself or herself by adjusting the force at ordinary times after the angle of an inclination is determined to be toward the left or right by a green inclination. At this time, it is possible to adjust the magnification of the angle of an inclination so that the magnification of the angle of an inclination may be enlarged or reduced by the 1:N magnification.

In addition, the coin-type small battery 700 is configured to contact with and supply power to the tri-axial MEMS sensor 100, the digital left and right inclination angle indication pointer 200, the digital up and down inclination angle indication pointer 300, the digital display unit 400, the microprocessor 500, and the inclination angle indication magnification control unit 600.

At this time, the coin-type small battery 700 is configured to turn on/off the power supply by a power On/Off button 610 of the inclination angle indication magnification adjustment unit.

Figure 4:
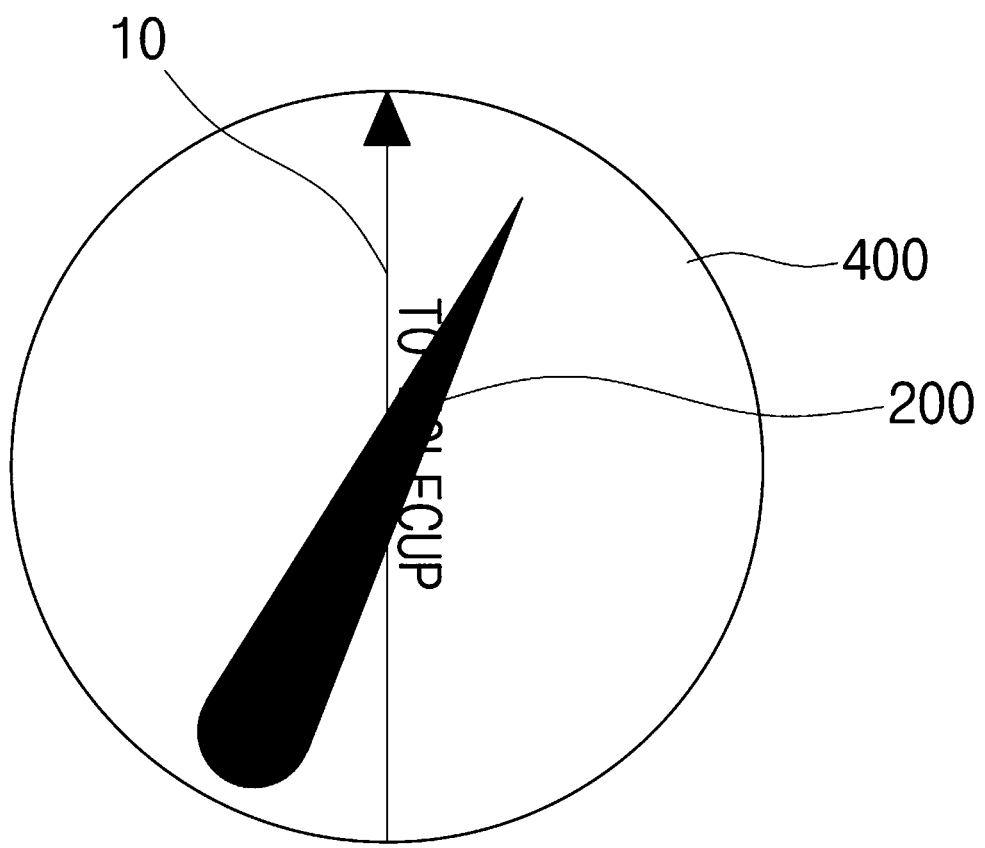
FIG. 4 is a view showing an angle of a left and right inclination at which a shape of a putting direction pointer is displayed to the right in the case that the digital direction-guiding apparatus for golf putting according to the embodiment of the present disclosure is tilted to the left side when placed on a green.
Figure 5:
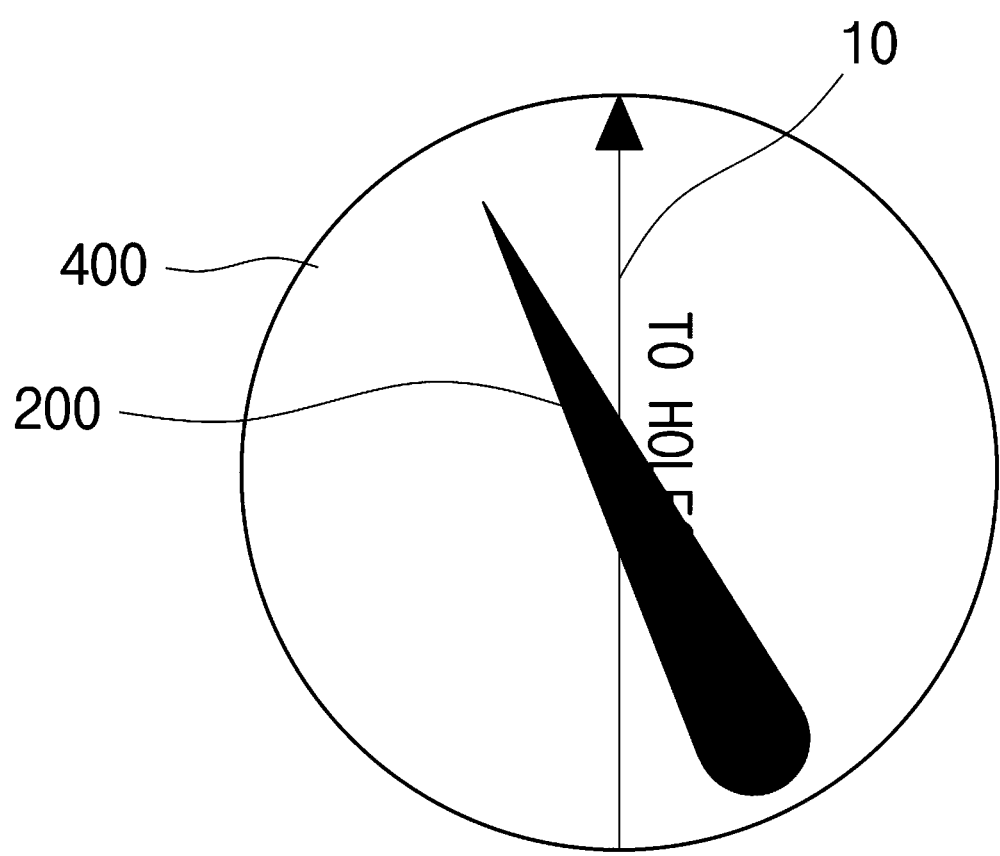
FIG. 5 is a view showing an angle of a left and right inclination at which a shape of the putting direction pointer is displayed to the left in the case that the digital direction-guiding apparatus for golf putting according to the embodiment of the present disclosure is tilted to the right side when placed on the green.

In addition, as shown in FIGS. 4 and 5, the digital left and right inclination angle indication pointer 200 is configured to point in a putting direction to the left or right with respect to the location of the hole cup 20 according to the left and right inclination angle measurement value received from the tri-axial MEMS sensor 100.

Specifically, the digital left and right inclination angle indication pointer 200 is configured, according to the left and right inclination angle measurement value received from the tri-axial MEMS sensor 100 when the main body is placed on the green, to be marked in the right direction in response to the angle of an inclination when the angle of an inclination is determined to be toward the left by the green inclination and to be marked in the left direction in response to the angle of an inclination when the angle of an inclination is determined to be toward the right by the green inclination.

Figure 6:
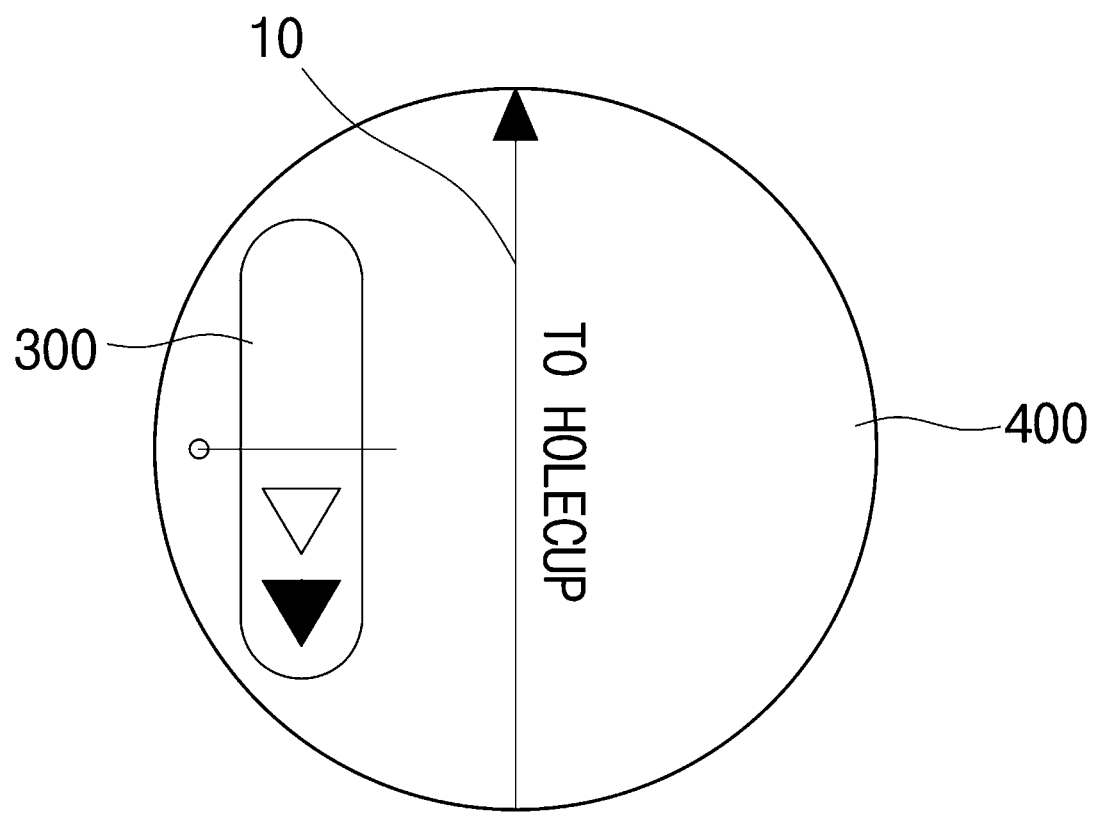
FIG. 6 is a view showing a shape of an up-and-down direction pointer marked rearward indicating downhill when a point a golf ball is seated is higher than a location of a hole cup when the digital direction-guiding apparatus for golf putting according to the embodiment of the present disclosure is placed on the green.
Figure 7:
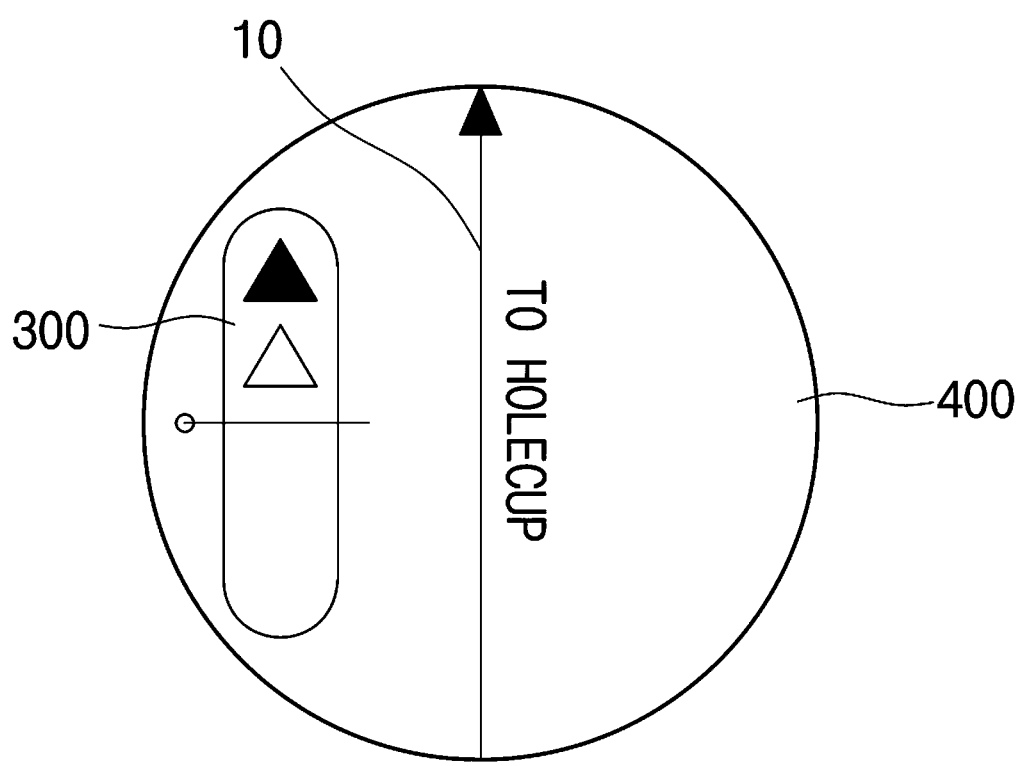
FIG. 7 is a view showing a shape of an up-and-down direction pointer marked forward indicating uphill when a point a golf ball is seated is lower than the location of the hole cup when the digital direction-guiding apparatus for golf putting according to the embodiment of the present disclosure is placed on the green.

In addition, as shown in FIGS. 6 and 7, the digital up and down inclination angle indication pointer 300 is configured, according to the up and down inclination angle measurement value received from the tri-axial MEMS sensor 100 when the main body is placed on the green, to output an arrow guiding that a slope of a front side is downhill by being marked rearward when a seating point of the golf ball 30 is higher compared with the location of the hole cup 20 and to output an arrow guiding that a slope of the front side is uphill by being marked forward when a seating point of the golf ball 30 is lower compared with the location of the hole cup 20.

At this time, the digital up and down inclination angle indication pointer 300 is configured to allow a degree of inclination to be checked by outputting the number of arrows.

According to the digital direction-guiding apparatus 1000 for golf putting according to the embodiment of the present disclosure as described above, as the tri-axial MEMS sensor 100 and the digital display unit 400 are applied. When the main body is placed on the green, in the case that the angle of an inclination is determined to be toward the left by the green inclination, the digital left and right inclination angle indication pointer 200 is displayed in the right direction through the digital display unit 400, and in the case that the angle of an inclination is determined to be toward the right by the green inclination, the digital left and right inclination angle indication pointer 200 is displayed in the left direction through the digital display unit 400.

In addition, when the main body is placed on the green, provided the seating point of the golf ball is higher compared with the location of the hole cup 20, the digital up and down inclination angle indication pointer 300 is marked to be rearward side or marked in letters to be downhill side through the digital display unit 400, whereby the slope of the front side may be noticed to be downhill, and provided the seating point of the golf ball is lower compared with the location of the hole cup 20, the digital up and down inclination angle indication pointer 300 is marked to be forward side or marked in letters to be uphill side through the digital display unit 400, whereby the slope of the front side may be confirmed to be uphill.

Figure 8:
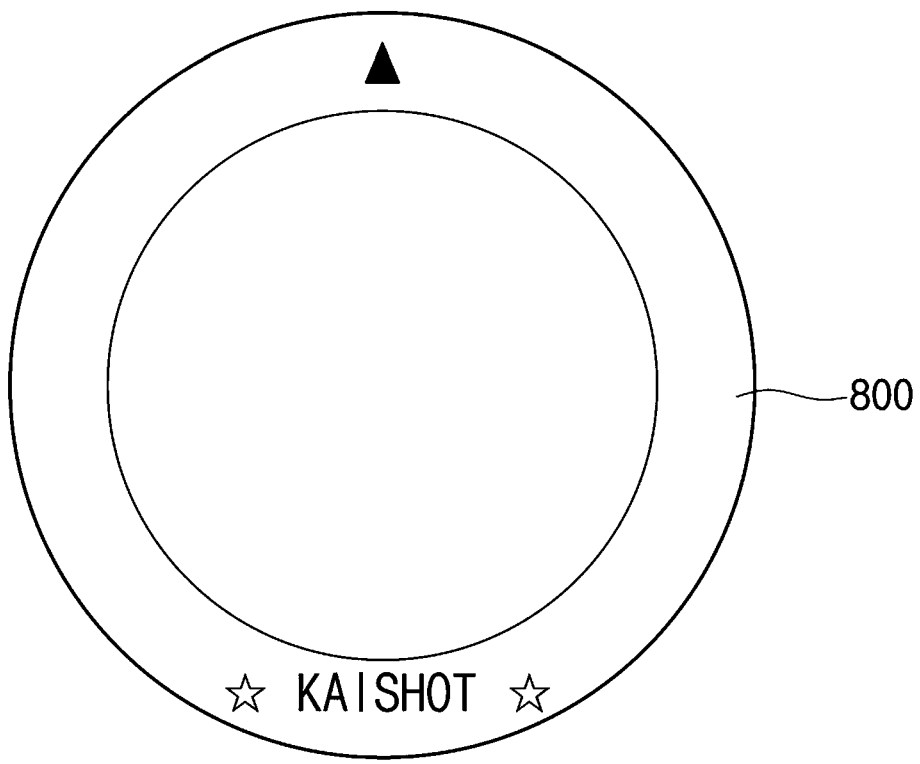
FIG. 8 is a view showing a ring detachable on a lower end of the digital direction-guiding apparatus for golf putting according to the embodiment of the present disclosure and a unique individual marker displaying by engraving letters, a name, or symbols requested by a user on a surface of the ring.
Figure 8:
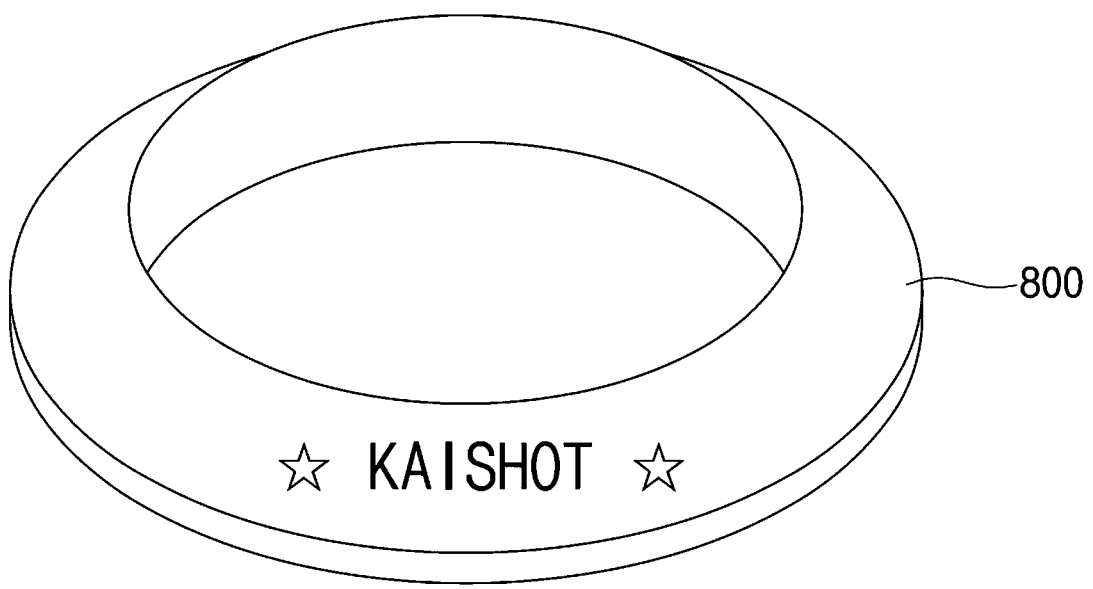
Figure 9:
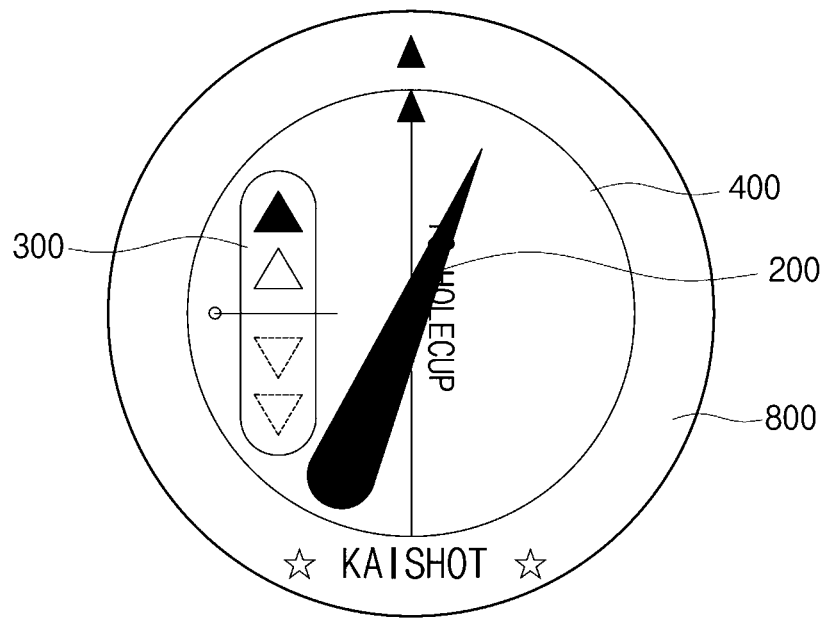
FIG. 9 is a three-dimensional picture and perspective view showing that the ring is attached to the lower end of the digital direction-guiding apparatus for golf putting according to an embodiment of the present disclosure.
Figure 9:
Figure 9:
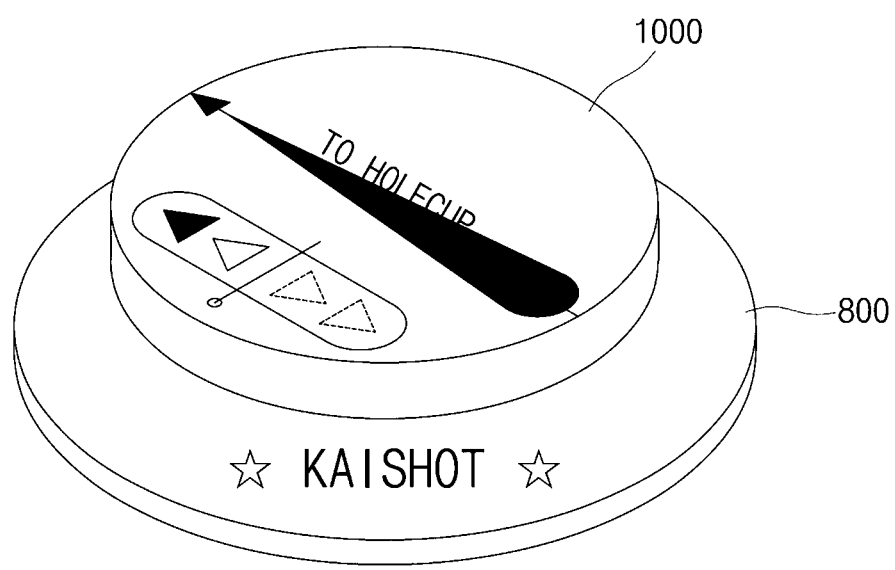

In addition, as shown in FIGS. 8 and 9, the digital direction-guiding apparatus 1000 for golf putting according to the embodiment of the present disclosure further includes a ring 800 detachable on a lower end of the main body.

Such a ring 800 is fittedly coupled to the main body and is configured to give a sense of weight and may be configured as a unique individual marker by engraving text or symbols that comply with a user's demand on a surface thereof.

To summarize, the digital direction-guiding apparatus 1000 for golf putting according to the embodiment of the present disclosure is configured to output the left and right inclination angle measurement value and the up and down inclination angle measurement value through the digital display unit 400, thereby being allowed to be configured to have good visibility and a thin overall thickness compared with to a direction indication device in an analog form.

In addition, the ring 800 engraved with the text or symbols that comply with the user's demand is configured to be detachable to the main body, whereby a direction indication device that is specialized to the individual and sophisticated is allowed to be configured.

Although described and shown in relation to an exemplary embodiment for illustrating the technical idea of the present disclosure as described above, it will be appreciated by those skilled in the art that the present disclosure is not limited to the configuration and operation as shown and described, and that many changes and modifications may be made to the present disclosure without departing from the scope of the technical spirit. Accordingly, all such suitable alterations and modifications and equivalents are to be considered as being within the scope of the present disclosure.

DESCRIPTION OF THE REFERENCE NUMERALS IN THE DRAWINGS

10: Hole cup aiming reference line
20: Hole cup
30: Golf ball
100: Tri-axial MEMS sensor
200: Digital left and right inclination angle indication pointer
300: Digital up and down inclination angle indication pointer
400: Digital display unit
500: Microprocessor
600: Inclination angle display magnification adjustment unit
610: Power On/Off button
700: Coin-type small battery
800: Ring
1000: Digital direction-guiding apparatus for golf putting

The invention claimed is:

1. A digital direction-guiding apparatus for golf putting, the digital direction-guiding apparatus comprising:
    a tri-axial MEMS sensor (100) configured to measure an angle of a left and right inclination or an angle of an up and down inclination of a point at which a golf ball (30) is seated with respect to a location of a hole cup (20) after a direction indicated by a hole cup aiming reference line (10) matches up with a center of the hole cup (20);
    a digital left and right inclination angle indication pointer (200) configured to indicate a putting direction in correspondence to the angle of the left and right inclination with respect to the location of the hole cup (20) by receiving a left and right inclination angle measurement value;
    a digital up and down inclination angle indication pointer (300) configured to display the angle of the up and down inclination of the point at which the golf ball (30) is seated with respect to the location of the hole cup (20) by receiving an up and down inclination angle measurement value;
    a digital display unit (400) configured to output the left and right inclination angle measurement value and the up and down inclination angle measurement value, measured above, on a screen; and
    a microprocessor (500) built into a main body and configured, through the digital display unit (400), to control the left and right inclination angle measurement value and the up and down inclination angle measurement value to be output to the screen,
    wherein the digital direction-guiding apparatus further comprises an inclination angle display magnification adjustment unit (600) provided on a rear surface of the main body and configured to adjust the left and right inclination angle measurement value and the up and down inclination angle measurement value to be displayed in accordance with a magnification value received from a user to set the left and right and up and down inclination angle magnification values appropriate for the user's putting force; and wherein the inclination angle display magnification adjustment unit (600) is configured to memorize a last-inputted magnification value.

2. The digital direction-guiding apparatus of claim 1, wherein the digital left and right inclination angle indication pointer (200) is configured, according to the left and right inclination angle measurement value received from the tri-axial MEMS sensor (100) when the main body is placed behind the golf ball on a green, to be marked in a right direction in response to the angle of an inclination when the angle of the inclination is determined to be toward the left by a green inclination and to be marked in a left direction in response to the angle of the inclination when the angle of the inclination is determined to be toward the right by the green inclination.

3. The digital direction-guiding apparatus of claim 1, wherein the digital up and down inclination angle indication pointer (300) is configured, according to the up and down inclination angle measurement value received from the tri-axial MEMS sensor (100) when the main body is placed on a green, to output an arrow guiding that a slope of a front side is downhill by being marked rearward when a seating point of the golf ball (30) is higher compared with the location of the hole cup (20) and to output an arrow guiding that the slope of the front side is uphill by being marked forward when the seating point of the golf ball (30) is lower compared with the location of the hole cup (20).

4. The digital direction-guiding apparatus of claim 1, further comprising:

a ring (800) detachable on a lower end of the main body, wherein the ring 800 is fittedly coupled to the main body and configured as a marker engraved with text or symbols that comply with a user's demand on a surface thereof.

\* \* \* \* \*